United States Patent [19]

Kobler et al.

[11] Patent Number: 4,846,711

[45] Date of Patent: Jul. 11, 1989

[54] COAXIAL CONNECTOR IN A HOUSING BLOCK

[75] Inventors: Robert J. Kobler, Harrisburg; Ronald C. Laudig, Mechanicsburg; Tracy L. Smith, Harrisburg, all of Pa.

[73] Assignee: AMP Incorporated, Harrisburg, Pa.

[21] Appl. No.: 230,403

[22] Filed: Aug. 9, 1988

[51] Int. Cl.[4] ................................................ H05K 1/00

[52] U.S. Cl. ........................................ 439/63; 439/79; 439/741

[58] Field of Search ............ 439/55, 63, 675, 578–585, 439/78–83, 733, 741

[56] References Cited

U.S. PATENT DOCUMENTS

| | | | |
|---|---|---|---|
| 3,179,912 | 4/1965 | Huber et al. | 339/177 |
| 3,366,920 | 1/1968 | Laudig et al. | 439/581 |
| 3,383,457 | 5/1968 | Schumacher et al. | 339/177 |
| 3,915,535 | 10/1975 | O'Keefe et al. | 439/63 |
| 4,598,961 | 7/1986 | Cohen | 339/177 |
| 4,605,269 | 8/1986 | Cohen et al. | 339/177 R |
| 4,659,156 | 4/1987 | Johnescu et al. | 439/63 |
| 4,666,231 | 5/1987 | Sheesley et al. | 439/581 |

FOREIGN PATENT DOCUMENTS

| | | | |
|---|---|---|---|
| 8101631 | 6/1981 | PCT Int'l Appl. | 459/581 |

OTHER PUBLICATIONS

AMP "Subminiature D Pin and Socket Connectors per MIL-C-24308 (amplimite)" Catalog 79-547; 8-88.

*Primary Examiner*—David Pirlot
*Attorney, Agent, or Firm*—Gerald K. Kita

[57] ABSTRACT

A coaxial connector (17) comprises, a center contact (41), a dielectric body (50) encircling concentrically the center contact (41) and a conductive and unitary shell (25) encircling the dielectric body (50), and the shell (25) is adapted for insertion into and along a cavity (18) of a housing block (8), wherein each flange (31) of the shell (25) along a corresponding side of an open seam (30) projects outward radially from the shell (25) for alignment into and along a recess (20) extending in the housing block (8), and a corresponding terminal (33) extends from each flange (31) through the recess (20) and outwardly of the housing block (8), and the corresponding terminals (33) are side by side to provide a composite, single post (34) for insertion into a single aperture of a circuit board.

3 Claims, 4 Drawing Sheets

COAXIAL CONNECTOR IN A HOUSING BLOCK

FIELD OF THE INVENTION

The disclosure relates to a coaxial connector adapted for assembly into a housing block, particularly a housing block of a connector assembly.

BACKGROUND OF THE INVENTION

A known coaxial connector is disclosed in U.S. Pat. No. 4,598,961 and comprises; a center contact, a dielectric body encircling concentrically the center contact and a conductive and unitary shell encircling the dielectric body, an axially extending seam of the shell, and one or more projecting terminals of the shell adjacent to the seam for insertion into a corresponding aperture of a circuit board.

The known coaxial connector is constructed for assembly in a printed circuit board, and further is constructed with a ferrule member at a front end.

SUMMARY OF THE INVENTION

The present invention is an adaptation of the known coaxial connector for assembly into a cavity of a housing block, particularly a housing block of an electrical connector that has become familiar as a connector that satisfies published technical standards. For example, technical standards are useful to specify an electrical connector that will be incorporated as a component of electrical equipment. The specified connector will assure interconnection of the electrical equipment supplied by different manufacturers.

According to the invention, a coaxial connector comprises, a center contact, a dielectric body encircling concentrically the center contact and a conductive and unitary shell encircling the dielectric body, and the shell is adapted for insertion into and along a cavity of a housing block, wherein a flange of the shell is provided along each side of the seam and projects outward radially from the shell for alignment into and along the same recess extending in the housing block transversely of the cavity, and each corresponding terminal extends from a corresponding flange through the recess and outwardly of the housing block.

According to the known connector, the conductive shell is not adapted for insertion along a cavity of a housing block, and flanges of the shell are not arranged for insertion along a common recess of a housing block. The ferrule of the known connector resists insertion of the connector in a cavity of a housing block.

Further in an adaptation of a coaxial connector for insertion along a cavity of a housing block, each flange of the connector is connected to a corresponding terminal, and the corresponding terminals are side by side to provide a composite, single post for insertion into a single aperture of a circuit board.

According to the known connector, each terminal is separate from the others and is mounted in an aperture.

The invention is described by way of example in the following detailed description referring to accompanying drawings.

Figure 1:
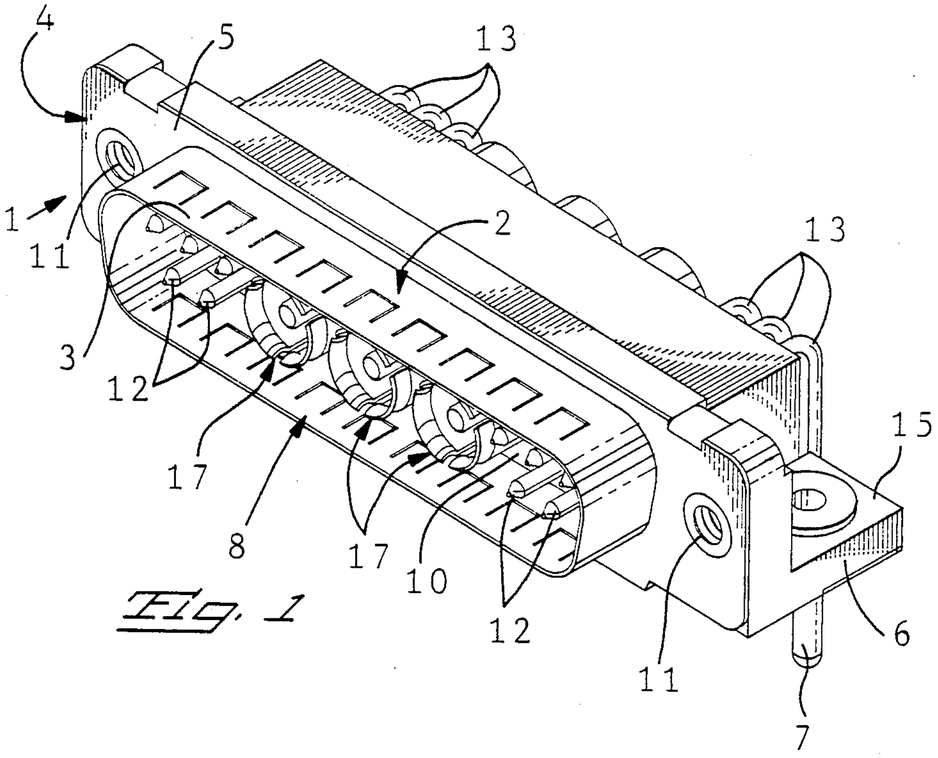
FIG. 1 is a perspective view of a connector.
Figure 2:
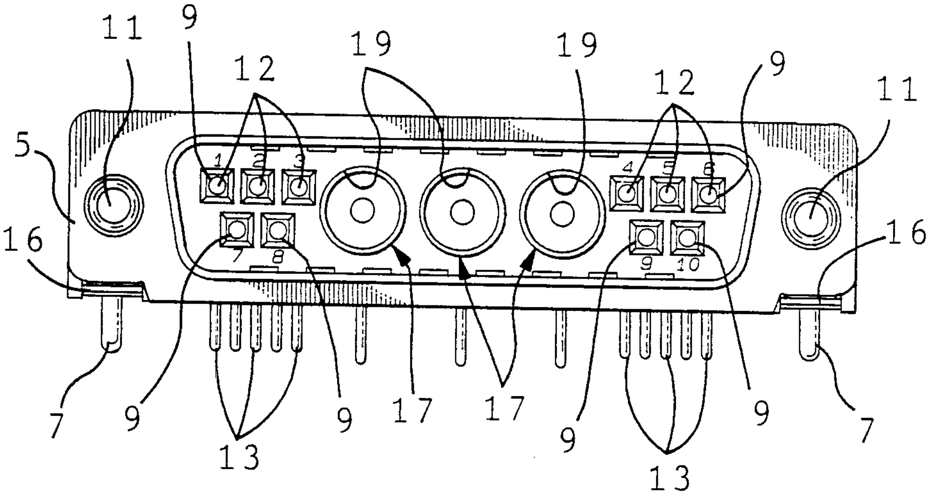
FIG. 2 is a front elevation view of the connector shown in FIG. 1.
Figure 3:
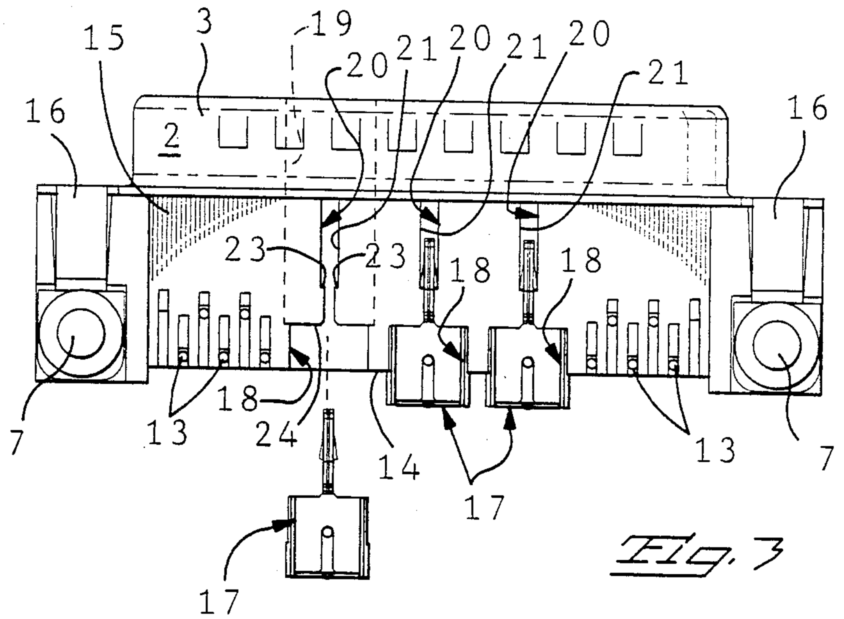
FIG. 3 is a bottom plan view of the connector shown in FIG. 2 and a connector for insertion into the connector.
Figure 4:
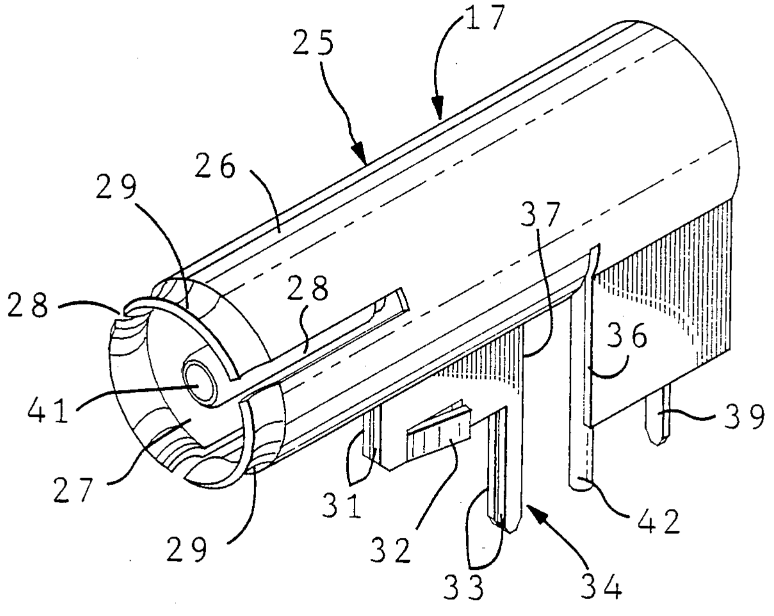
FIG. 4 is a perspective view of a connector for insertion into the connector shown in FIG. 1.
Figure 5:
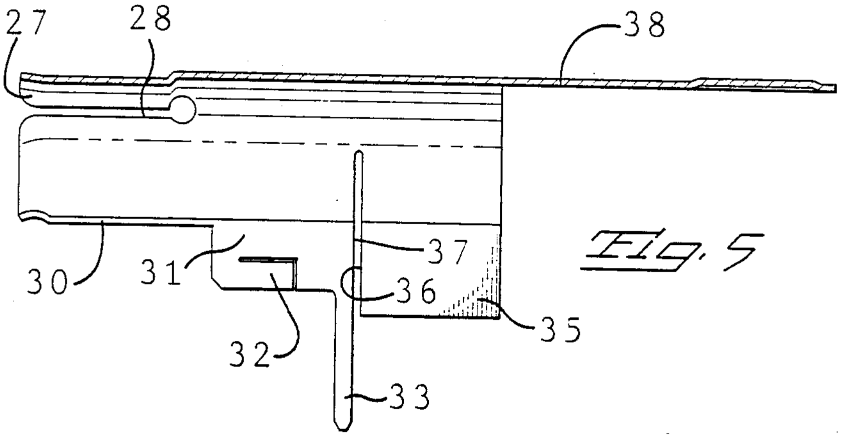
FIG. 5 is an elevation view in section of a shell of the connector shown in FIG. 4.
Figure 7:
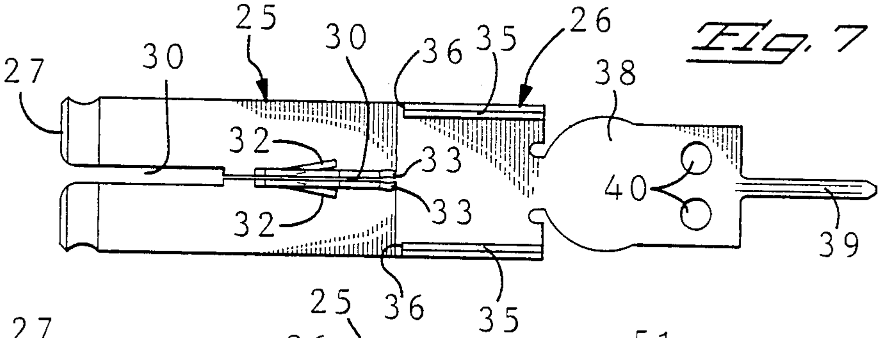
FIG. 7 is a bottom plan view of the shell shown in FIG. 5.
Figure 8:
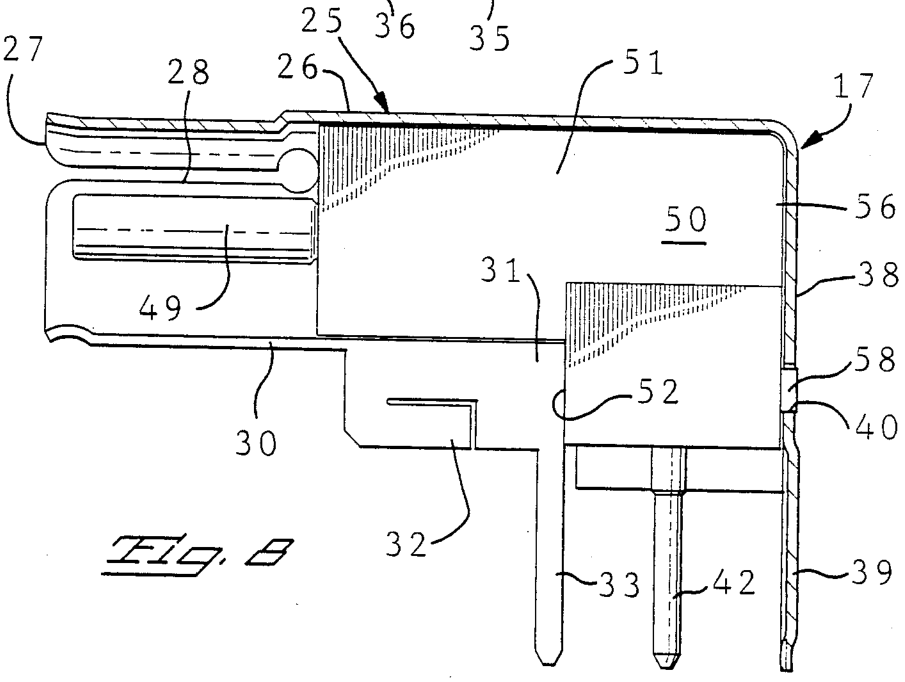
FIG. 8 is an elevation view in section of the connector shown in FIG. 4.
Figure 6:
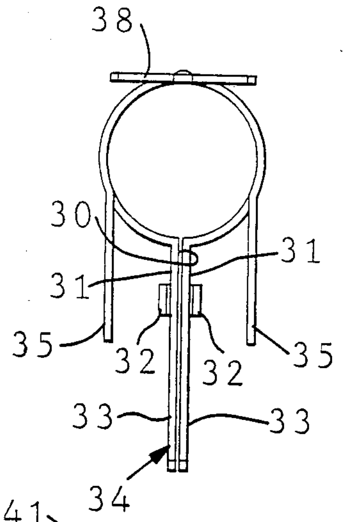
FIG. 6 is an end view of the shell shown in FIG. 5.

With reference to FIGS. 1, 2 and 3, an electrical connector assembly 1 includes a conductive shell 2, a front end 3 known as a standard D shaped interface, and a conductive mounting flange 4 with a portion 5 extending transverse to the front end 3 and having a base 6 intersecting the portion 5 at a right angle for mounting on a printed circuit board, not shown. Conductive posts 7 extend from the base 6 for insertion into apertures, not shown, of the printed circuit board. The connector assembly 1 includes an insulative housing block 8 mounting the flange 4 and having cavities 9 extending from a front end 10 of the housing block 8 and axially through the housing block 8. Internally threaded mounting lugs 11 project through the flange 4 for mounting a complementary connector, not shown, to the front end 3.

In the cavities 9 are mounted corresponding conductive contacts 12 of known construction. The contacts 12 have corresponding electrical terminals 13 that project from a rear end 14 of the housing block 8, are bent at corresponding angles, and project through an insulative base 15, that may be integral with the housing block 8 or provided as a separate part assembled as a composite part of the housing block 8. The contacts 12 connect with corresponding contacts, not shown, in the complementary connector. Conductive straps 16 extend from the conductive portion 5 of the flange 4 and connect to the fasteners 7, to connect the flange 4 to ground circuit paths (not shown) on a printed circuit board.

Ordinarily, the known contacts 12 are the only contacts in the housing block 8. However, the housing block 8 shown in FIGS. 1, 2 and 3 is modified with a set of three duplicate electrical connectors 17 in place of a number of the contacts 12 that are present ordinarily in the housing block 8. With reference to FIG. 3, each connector 17 is mounted in a corresponding cavity 18 of the housing block 8. Each cavity 18 has an axial cylindrical portion 19 of enlarged diameter communicating with the front end 10 of the housing block 8 and with the front end 3 of the connector assembly 1. Each cavity 18 communicates with a corresponding axial elongated recess 20 having a narrow portion 21 and an enlarged portion 22 communicating with the rear end 14 of the housing block 8. Forward facing shoulders 23 are along opposite sides of the narrow portion 21. A rear facing shoulder 24 is at the intersection of a corresponding narrow portion 21 and an enlarged portion 22 of each corresponding recess 20.

With reference to FIGS. 4-8, a corresponding connector 17 includes a conductive and unitary outer shell 25 adapted for insertion into and along a cylindrical portion 19 of a corresponding cavity 18. The shell 25 is formed from a strip of metal to provide an axial cylindrical portion 26 having an open front end 27, and is divided by axial slits 28 into axial fingers 29 to provide an electrical receptacle with an open front end 27.

A longitudinal open seam 30 extends along the cylindrical portion 26. A flange 31 extends along each corresponding side of the seam 30 and projects outward radially from the shell 25 for insertion into and along a corresponding recess 20 extending in the housing block 8. The strip of metal is cut to provide a locking tab 32 along each flange 31. Each locking tab 32 is bent to project rearward and diagonally out of the plane of the corresponding flange 31 for registration against a corresponding shoulder 23 to resist movement of the shell 25 rearwardly of the housing block 8. A corresponding terminal 33 extends from each flange 31 through the recess 20 of the housing block 8 and outwardly of the housing block 8 in the same direction as the terminals 13 of the contacts 12. The corresponding terminals 33 are side by side to provide a composite, single post 34 for insertion into a single aperture, not shown, of a printed circuit board.

Rearward of each flange 31 and of each terminal 33, the shell 25 is provided with spaced apart walls 35 having front ends 36 separated partially from the cylindrical portion 26 by corresponding slits 37. Between the walls 35 is defined a wide continuation of the slam 30 and an open rear end of the cylindrical portion 26. An end wall 38 of the shell 25 is connected to a rear end of the cylindrical portion 26 and momentarily extends axially of the cylindrical portion 26. An elongated electrical terminal 39 extends from the end wall 38. One or more apertures 40 extend through the end wall 38.

Figure 9:
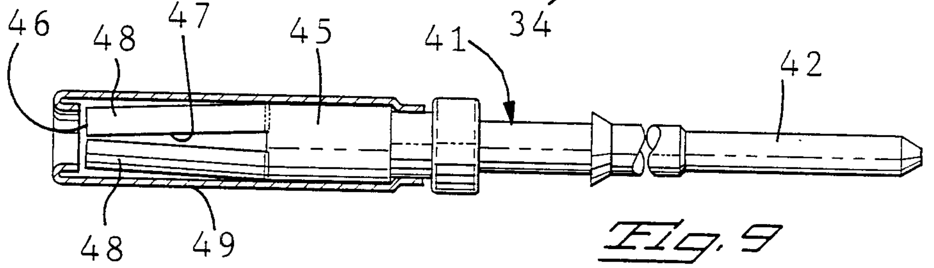
FIG. 9 is a plan view in section of an electrical contact of the connector shown in FIG. 4.
Figure 10:
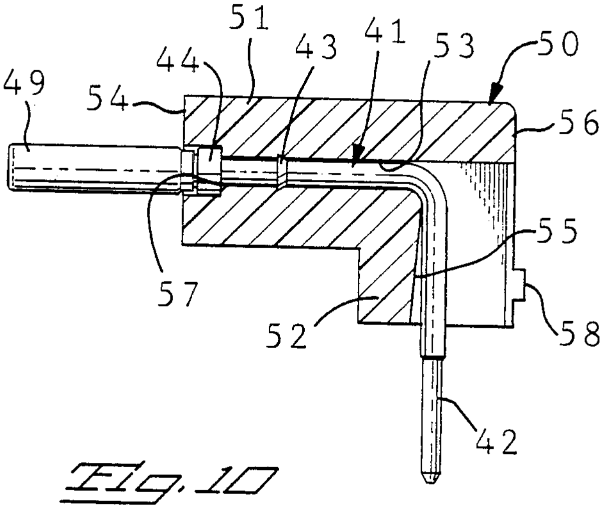
FIG. 10 is an elevation view in section of a dielectric body and the electrical contact of the connector shown in FIG. 4.
Figure 11:
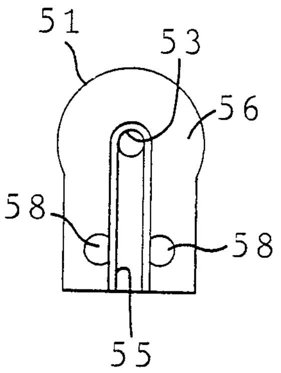
FIG. 11 is an end view of the dielectric body shown in FIG. 10.

With reference to FIGS. 9–11, the connector 17 includes a conductive center contact 41 of stepped diameter having an electrical terminal 42 at a rear end, a radially extending barb 43, a radially extending enlarged collar 44 and an electrical receptacle 45 having an open front end 46 and divided by axial slits 47 into axial fingers 48 to provide an electrical receptacle with an open front end 46. A thin metal sleeve or shroud 49 is assembled to encircle the receptacle.

An insulative body 50 includes a cylindrical portion 51 and a base portion 52 extending transversely of the cylindrical portion 51. An axial passage 53 of stepped diameter extends concentrically of the cylindrical portion 51 from a front end 54 of the body 50 and intersects a transverse passage 55 communicating with a rear end 56 of the body 50 and with the base portion 52.

The center contact 41 of the connector 17 is assembled into and along the passage 53 from the front end 54 until the collar 44 registers against a front facing shoulder 57 in the passage 53. The barb 43 penetrates into the body 50 to resist movement of the center contact 41. The terminal 42 of the center contact 41 then will emerge from the rear end 56 of the body 50 and can be bent to project outwardly of the base 52, at an angle with respect to the remainder of the center contact 41.

The insulative body 50 and the center contact 41 are assembled with the shell 25, into and along the open rear end of the shell 25 until the transverse portion 52 of the insulative body 50 engages a rear of the corresponding flanges 31. The terminal 42 will project between the walls 35 in the same direction as the post 34. At least one peg 58 corresponding to an aperture 40 projects from the rear end 56 of the dielectric body 50. The end wall 38 of the shell 25 is folded where joined to the cylindrical portion 26 of the shell 25 to overlap the end 56 of the dielectric body 50. The end wall 38 includes an aperture 40 corresponding to each peg 58, and each corresponding peg 58 extends through a corresponding aperture 40. Each peg 58 emerges from a corresponding aperture 40 and is enlarged, for example, by the application of heat and pressure, to resist movement of the insulative body 50.

The connector 17 is inserted into and along a portion 19 of a corresponding cavity 18, from the rear end 14 of the housing block 8 until the walls 35 register against the rear facing shoulder 24, resisting movement of the connector 17 forwardly of the housing block 8. The flanges 32 are inserted into and along the narrow portion 21 of a corresponding recess 20 until engaged against the rear facing shoulders 23 of the housing block 8, resisting movement of the connector 17 rearwardly of the housing block 8. The receptacle 27 is in position at the front end 10 of the connector assembly 1 to couple with a complementary connector, not shown. The terminals 33 and 42 of the connector 17 project through the recess 20 and outwardly through the base 15 of the housing block 8, and in the same direction as the terminals 13 for insertion into corresponding apertures, not shown, of a printed circuit board. The terminal 39 of each connector 17 is in alignment axially of the connector assembly 1 with the corresponding terminals 33 and 42.

We claim:

1. A coaxial connector comprising; a center contact, a dielectric body encircling concentrically the center contact and a conductive and unitary shell encircling the dielectric body, and axially extending seam of the shell, and one or more projecting terminals of the shell adjacent to the seam for insertion into a corresponding aperture of a circuit board, wherein the improvement comprises;

the shell is adapted for insertion into and along a cavity of a housing block, wherein a flange of the shell is provided along each side of the seam and projects outward radially from the shell for alignment into and along the same recess extending in the housing block transversely of the cavity, each corresponding terminal extends from a corresponding flange through the recess and outwardly of the housing block, at least one peg projecting from an end of the dielectric body, an end wall of the shell is folded to overlap the end of the dielectric body, the end wall includes an aperture corresponding to each peg, and each corresponding peg extends through a corresponding aperture.

2. A coaxial connector as recited in claim 1, wherein the improvement comprises; each flange is connected to a corresponding terminal, and the corresponding terminals are side by side to provide a composite, single post for insertion into a single aperture of a circuit board.

3. A coaxial connector as recited in claim 1, wherein the improvement comprises;

a lance projects outwardly of each corresponding flange for locked registration in the recess of the housing block.

* * * * *